US012738337B2

(12) United States Patent
Park et al.

(10) Patent No.: US 12,738,337 B2
(45) Date of Patent: Sep. 15, 2026

(54) MEMORY HAVING LATCH CIRCUIT AND MEMORY SYSTEM

(71) Applicant: SK hynix Inc., Gyeonggi-do (KR)

(72) Inventors: Min Su Park, Gyeonggi-do (KR); Kyung Whan Kim, Gyeonggi-do (KR); Choung Ki Song, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 100 days.

(21) Appl. No.: 18/810,519

(22) Filed: Aug. 21, 2024

(65) Prior Publication Data

US 2025/0378899 A1 Dec. 11, 2025

(30) Foreign Application Priority Data

Jun. 10, 2024 (KR) ........................ 10-2024-0074972

(51) Int. Cl.

| | |
|---|---|
| ***G11C 29/44*** | (2006.01) |
| ***G11C 29/00*** | (2006.01) |
| *G06F 11/00* | (2006.01) |
| *G06F 13/00* | (2006.01) |

(52) U.S. Cl.

CPC .................................... *G11C 29/44* (2013.01)

(58) Field of Classification Search

CPC ......... G11C 29/44; G11C 29/42; G11C 29/46; G11C 11/407; G11C 29/00; G11C 11/56; G11C 7/10; G06F 11/10; G06F 11/1076; G06F 11/14; G01R 31/317; G01R 31/319

USPC .......................................................... 714/719

See application file for complete search history.

(56) References Cited

U.S. PATENT DOCUMENTS 7,301,822 B1 * 11/2007 Walstrum, Jr. ... H03K 19/17772 326/38

7,401,270 B2 * 7/2008 Hummler ............. G11C 29/846 714/710

11,430,539 B2 * 8/2022 Manning ................ G11C 29/42

2014/0185398 A1 * 7/2014 Franceschini ........ G11C 29/789 365/200

2017/0185499 A1 6/2017 Lee et al.

2023/0315918 A1 * 10/2023 Eichmeyer ............. G11C 17/18

FOREIGN PATENT DOCUMENTS

KR 10-2022-0124050 A 9/2022

OTHER PUBLICATIONS

Weizhe Hua, Ramy N. Tadros, and Peter A. Beerel. 2016. Low Area, Low Power, Robust, Highly Sensitive Error Detecting Latch for Resilient Architectures. In Proceedings of the 2016 International Symposium on Low Power Electronics and Design (ISLPED '16). (Year: 2016).*

* cited by examiner

*Primary Examiner* — Esaw T Abraham
*Assistant Examiner* — Grace V Braden
(74) *Attorney, Agent, or Firm* — IP & T GROUP LLP

(57) ABSTRACT

A memory may include a memory array configured to store write data therein and provide the write data stored therein as read data, a nonvolatile memory circuit configured to store repair information therein, a repair latch circuit configured to receive the repair information from the nonvolatile memory circuit and store the received repair information during a boot-up operation, and a repair circuit configured to repair the memory array using the stored repair information of the repair latch circuit, wherein the boot-up operation is performed during an initial operation period of the memory and is performed one or more times thereafter.

11 Claims, 6 Drawing Sheets

120
CA_BUS
201
Manage_BUS
205
COMMAND DECODER
211
ACT
PCG
RD
WR
ADDRESS CONTROL CIRCUIT
215
R_ADD
C_ADD
R_ADD
280
ROW REPAIR UNIT
281
ACT
PCG
ROW CIRCUIT
250
MEMORY ARRAY
240
COLUMN CIRCUIT
260
RD WR
270
ROW REPAIR LATCH UNIT
271
REPAIR_R_ADD
COLUMN REPAIR UNIT
285
BOOT-UP CONTROL CIRCUIT
220
BOOT-UP
NONVOLATILE MEMORY CIRCUIT
230
COLUMN REPAIR LATCH UNIT
275
REPAIR_C_ADD
C_ADD
203
DATA_BUS
SETTING LATCH CIRCUIT
295
SETTING CIRCUIT
291

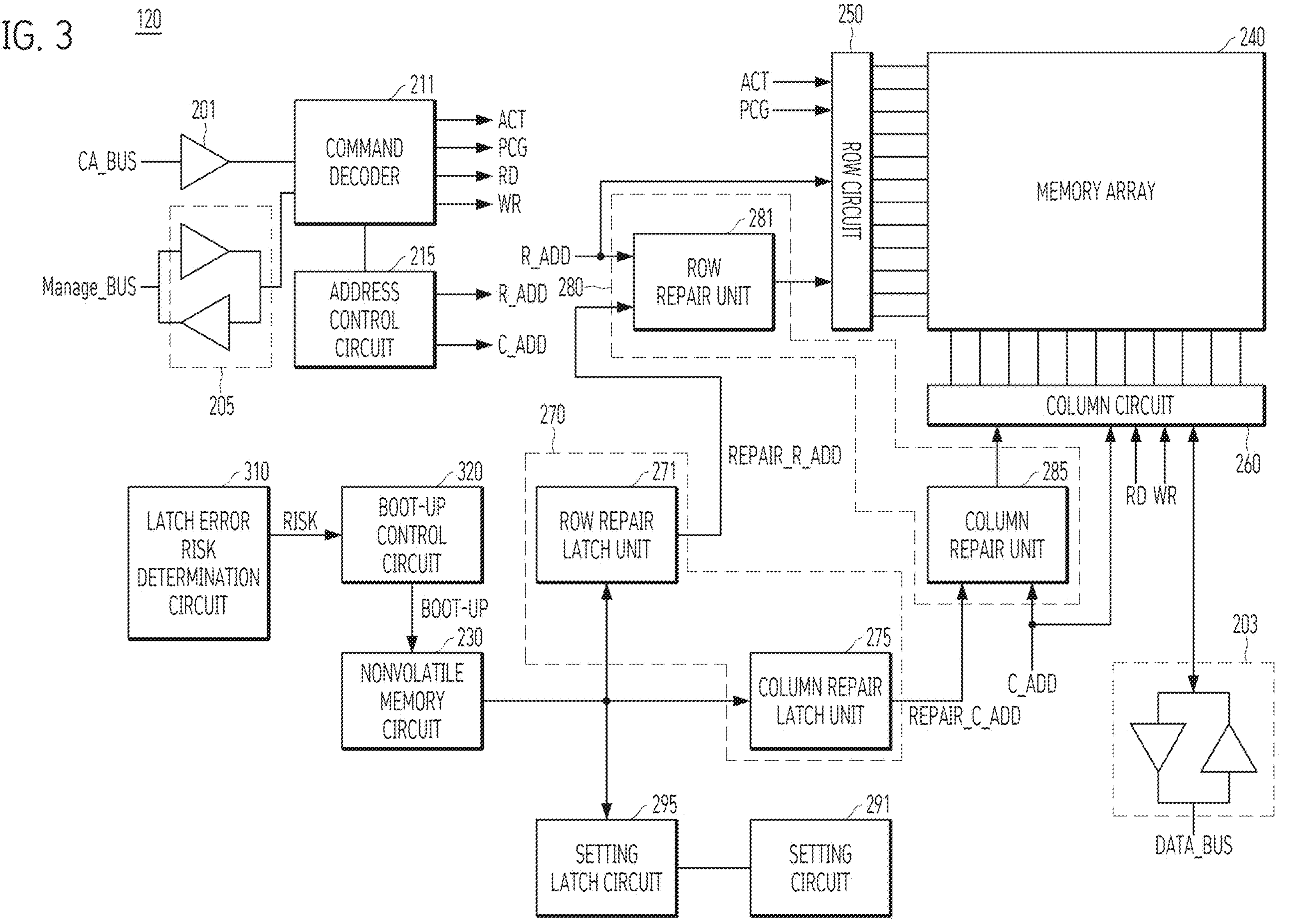
FIG. 3
120
CA_BUS
201
Manage_BUS
205
COMMAND DECODER
211
ACT
PCG
RD
WR
ADDRESS CONTROL CIRCUIT
215
R_ADD
C_ADD
R_ADD
280
ROW REPAIR UNIT
281
ACT
PCG
ROW CIRCUIT
250
MEMORY ARRAY
240
COLUMN CIRCUIT
260
RD WR
LATCH ERROR RISK DETERMINATION CIRCUIT
310
RISK
BOOT-UP CONTROL CIRCUIT
320
BOOT-UP
NONVOLATILE MEMORY CIRCUIT
230
270
ROW REPAIR LATCH UNIT
271
REPAIR_R_ADD
COLUMN REPAIR UNIT
285
COLUMN REPAIR LATCH UNIT
275
REPAIR_C_ADD
C_ADD
203
DATA_BUS
SETTING LATCH CIRCUIT
295
SETTING CIRCUIT
291

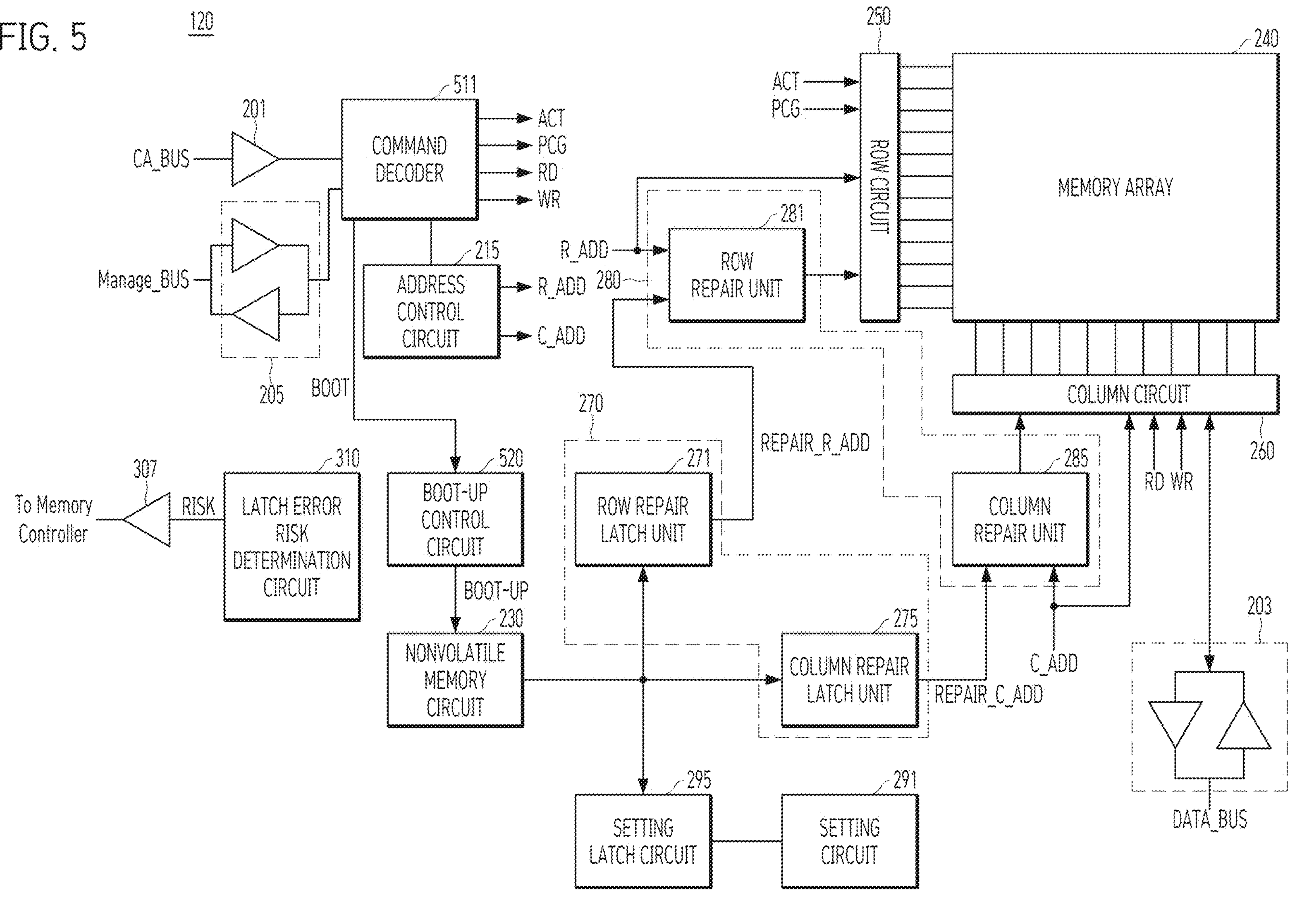
FIG. 5
120
CA_BUS
201
Manage_BUS
205
BOOT
511
COMMAND DECODER
ACT
PCG
RD
WR
215
ADDRESS CONTROL CIRCUIT
R_ADD
C_ADD
520
BOOT-UP CONTROL CIRCUIT
BOOT-UP
230
NONVOLATILE MEMORY CIRCUIT
310
LATCH ERROR RISK DETERMINATION CIRCUIT
RISK
307
To Memory Controller
250
ROW CIRCUIT
240
MEMORY ARRAY
260
COLUMN CIRCUIT
RD WR
203
DATA_BUS
280
281
ROW REPAIR UNIT
285
COLUMN REPAIR UNIT
REPAIR_R_ADD
REPAIR_C_ADD
270
271
ROW REPAIR LATCH UNIT
275
COLUMN REPAIR LATCH UNIT
291
SETTING CIRCUIT
295
SETTING LATCH CIRCUIT

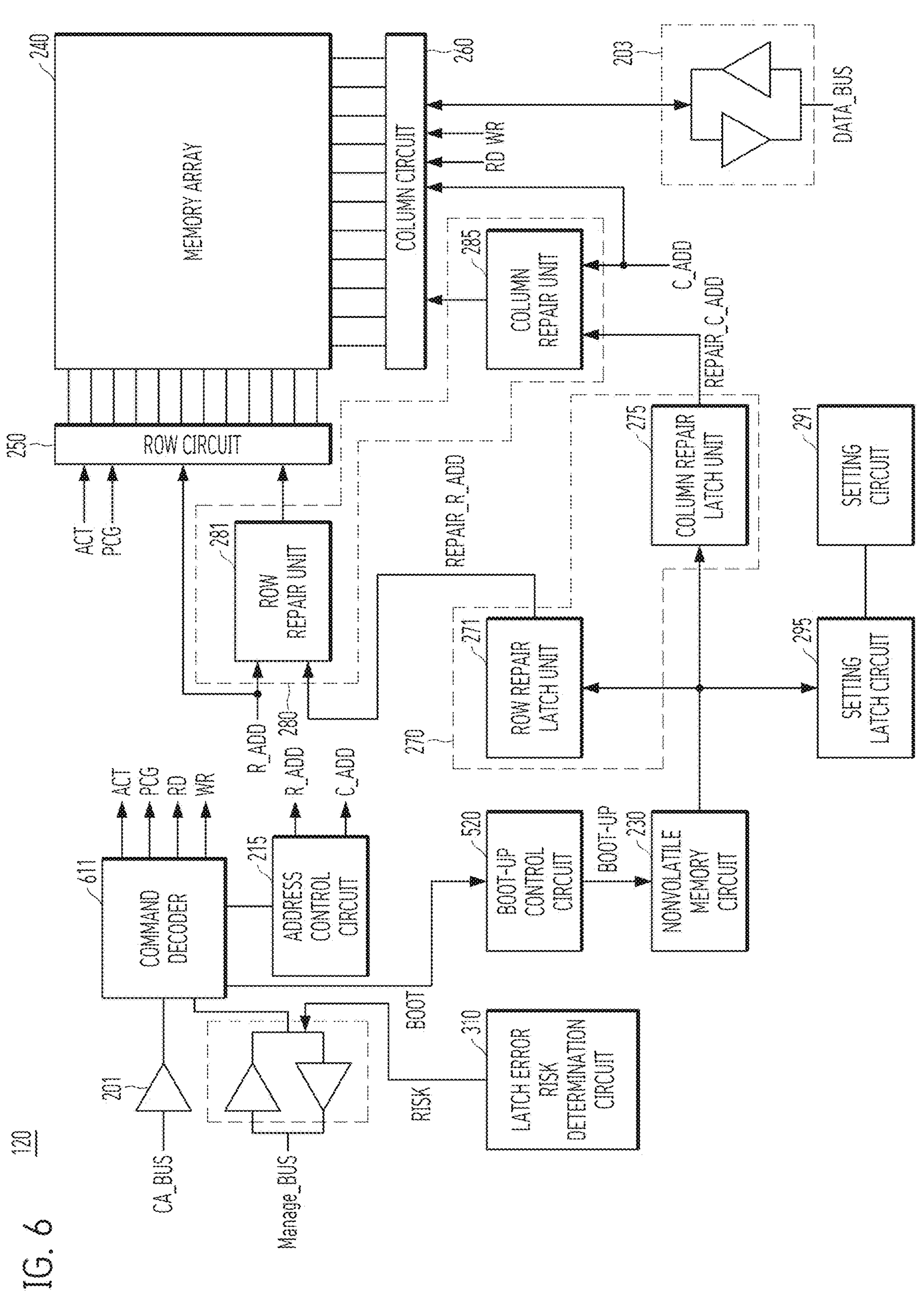
FIG. 6
120
CA_BUS
201
Manage_BUS
COMMAND DECODER
611
ACT
PCG
RD
WR
ADDRESS CONTROL CIRCUIT
215
R_ADD
C_ADD
BOOT
RISK
LATCH ERROR RISK DETERMINATION CIRCUIT
310
BOOT-UP CONTROL CIRCUIT
520
BOOT-UP
NONVOLATILE MEMORY CIRCUIT
230
ROW REPAIR LATCH UNIT
271
270
SETTING LATCH CIRCUIT
295
SETTING CIRCUIT
291
COLUMN REPAIR LATCH UNIT
275
REPAIR_R_ADD
REPAIR_C_ADD
ROW REPAIR UNIT
281
280
COLUMN REPAIR UNIT
285
ROW CIRCUIT
250
MEMORY ARRAY
240
COLUMN CIRCUIT
260
RD WR
203
DATA_BUS

MEMORY HAVING LATCH CIRCUIT AND MEMORY SYSTEM

CROSS-REFERENCE TO RELATED APPLICATION(S)

This application claims priority under 35 U.S.C. § 119 to Korean Patent Application No. 10-2024-0074972, filed on Jun. 10, 2024, the disclosure of which is incorporated herein by reference in its entirety.

BACKGROUND

1. Technical Field

Various embodiments of the present disclosure relate to a memory and a memory system including the memory.

2. Related Art

In the early stage of the semiconductor memory industry, a number of originally good dies with no defective memory cells in a memory fabricated through a semiconductor fabrication process were distributed on a wafer. However, as the capacity of a memory gradually increases, it becomes difficult to fabricate a memory that does not have any defective memory cells. Nowadays, it may be said that there are substantially no chances that such a memory can be fabricated. One way to resolve this concern is to repair defective memory cells in a memory with redundant memory cells.

SUMMARY

In accordance with an embodiment of the present disclosure, a memory may include a memory array configured to store write data therein and provide the write data stored therein as read data; a nonvolatile memory circuit configured to store repair information therein; a repair latch circuit configured to receive the repair information from the nonvolatile memory circuit and store the received repair information during a boot-up operation; and a repair circuit configured to repair the memory array using the stored repair information of the repair latch circuit, wherein the boot-up operation may be performed during an initial operation period of the memory and be performed one or more times thereafter.

In accordance with an embodiment of the present disclosure, a memory system may include a memory; and a memory controller configured to control the memory, wherein the memory may include: a memory array configured to store write data received from the memory controller and provide the memory controller with the write data stored therein as read data; a nonvolatile memory circuit configured to store repair information therein; a repair latch circuit configured to receive the repair information from the nonvolatile memory circuit and store the received repair information during a boot-up operation; and a repair circuit configured to repair the memory array using the stored repair information of the repair latch circuit, wherein the boot-up operation may be performed during an initial operation period of the memory and be performed one or more times thereafter.

In accordance with an embodiment of the present disclosure, a memory system may include a memory; and a baseboard management controller connected to the memory through a management bus, wherein the memory may include a memory array configured to store write data therein and provide the write data stored therein as read data; a nonvolatile memory circuit configured to store repair information therein; a repair latch circuit configured to receive the repair information from the nonvolatile memory circuit and store the repair information during a boot-up operation; and a repair circuit configured to repair the memory array using the stored repair information of the repair latch circuit, wherein the boot-up operation may be performed during an initial operation period of the memory and thereafter when the baseboard management controller instructs the memory to perform the boot-up operation.

BRIEF DESCRIPTION OF THE DRAWINGS

FIG. 3 is a block diagram illustrating another embodiment of a memory illustrated in FIG. 1.

FIG. 5 is a block diagram illustrating another embodiment of a memory illustrated in FIG. 1.

FIG. 6 is a block diagram illustrating another embodiment of a memory illustrated in FIG. 1.

DETAILED DESCRIPTION

Various embodiments of the present disclosure are directed to a technology of reducing errors in a latch circuit used for repair in a memory.

According to embodiments of the present disclosure, it is possible to reduce errors in a latch circuit used for repair in a memory.

Hereinafter, various embodiments according to the technical spirit of the present disclosure are described below with reference to the accompanying drawings.

Figure 1:
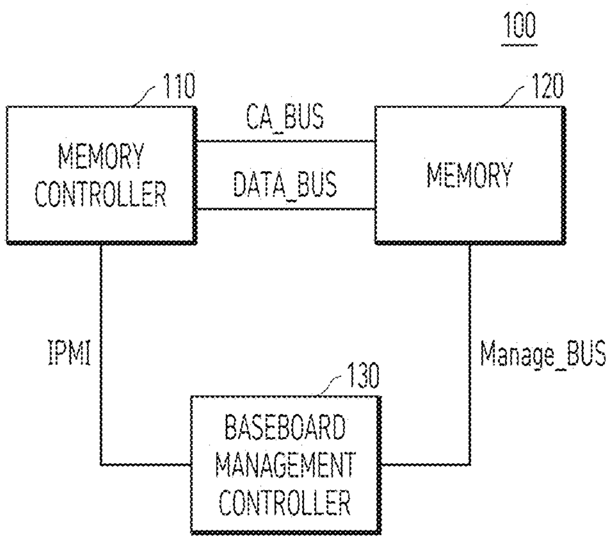
FIG. 1 is a block diagram illustrating a memory system in accordance with an embodiment of the present disclosure.

FIG. 1 is a block diagram illustrating a memory system 100 in accordance with an embodiment of the present disclosure.

Referring to FIG. 1, the memory system 100 may include a memory controller 110, a memory 120, and a baseboard management controller 130.

The memory controller 110 may control operations of the memory 120. The memory controller 110 may be included in a processor such as a central processing unit (CPU), a graphic processing unit (GPU), or an application processor (AP). The memory controller 110 may transmit commands and addresses to the memory 120 through a command address bus CA_BUS, and may transmit and receive data with the memory 120 through a data bus DATA_BUS.

The memory 120 may perform a read operation and a write operation under the control of the memory controller 110. The memory 120 may perform operations instructed by the commands and addresses transmitted through the command address bus CA_BUS. During the read operation, the memory 120 may transmit read data to the memory controller 110 through the data bus DATA_BUS. During the write operation, the memory 120 may receive write data transmitted by the memory controller 110 through the data bus DATA_BUS.

The baseboard management controller (BMC) 130 may include a device, which performs management and monitoring functions, mounted on a baseboard of a device such as a server or a personal computer (PC). The baseboard management controller 130 may communicate with the memory 120 to manage the memory 120. Further, the baseboard management controller 130 may communicate with the memory controller 110 to check a state of the memory system and manage the memory system or diagnose problems in the memory system. In some embodiments, an interface called an intelligent platform management interface (IPMI) may be mainly used for the communication between the baseboard management controller 130 and the memory controller 110. The communication between the baseboard management controller 130 and the memory 120 may be performed through a management bus Manage_BUS. The management bus Manage_BUS may use a memory module management control (M3C) interface similar to an inter-integrated circuit (I2C) interface.

The command address bus CA_BUS and the data bus DATA_BUS between the memory controller 110 and the memory 120 are used to perform a main function of the memory 120. Thus, an interface associated with the command address bus CA_BUS and the data bus DATA_BUS is referred to as an in-band interface. The management bus Manage_BUS between the baseboard management controller 130 and the memory 120 is used for additional control or management over the memory 120. Thus, an interface associated with the management bus Manage_BUS is referred to as a side-band interface.

Figure 2:
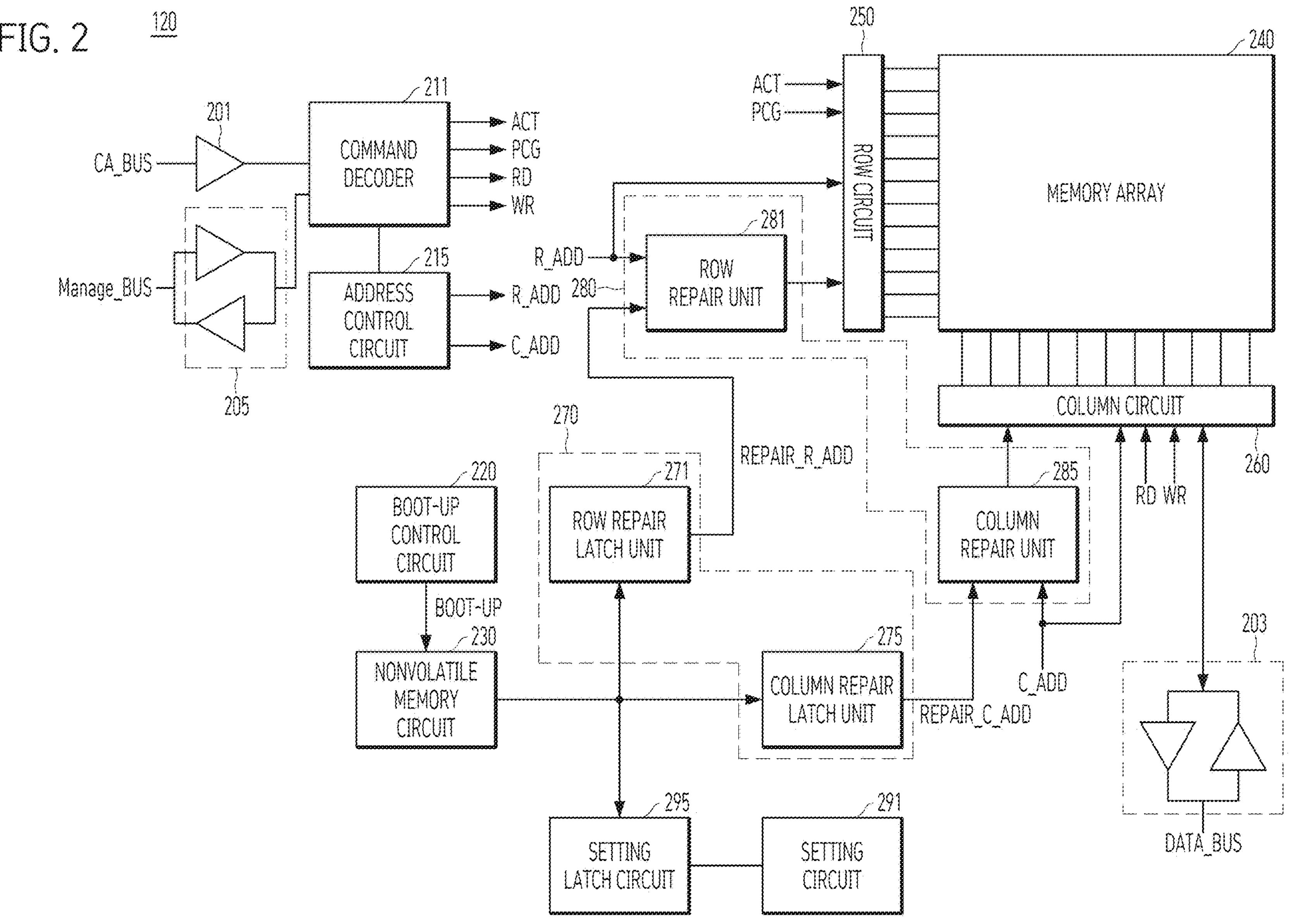
FIG. 2 is a block diagram illustrating an embodiment of a memory illustrated in FIG. 1.

FIG. 2 is a block diagram illustrating an embodiment of the memory 120 illustrated in FIG. 1.

Referring to FIG. 2, the memory 120 may include a command address receiving circuit 201, a data transmitting/receiving circuit 203, a management bus transmitting/receiving circuit 205, a command decoder 211, an address control circuit 215, a boot-up control circuit 220, a nonvolatile memory circuit 230, a memory array 240, a row circuit 250, a column circuit 260, a repair latch circuit 270, a repair circuit 280, a setting circuit 291, and a setting latch circuit 295.

The command address receiving circuit 201 may receive a command and address CA (i.e., a command and an address) through the command address bus CA_BUS. Depending on the type of memory 120, the command address receiving circuit 201 may receive the command and address CA. Depending on the type of memory 120, the command and address CA may be inputted to the same input terminals, or the command and address CA may be inputted to separate input terminals. In the present embodiment, an example in which the command and address CA are inputted to the same input terminals is described. Each of the command and address CA may have multi-bits.

The data transmitting/receiving circuit 203 may receive data DATA through the data bus DATA_BUS or transmit the data DATA to the data bus DATA_BUS. The data transmitting/receiving circuit 203 may receive the data DATA to be written to the memory array 240 during the write operation, and transmit data read from the memory array 240 during the read operation.

The management bus transmitting/receiving circuit 205 may transmit and receive signals with the baseboard management controller 130 through the management bus Manage_BUS.

The command decoder 211 may decode the command and address CA to find out the type of operations on the memory 120, which are instructed by the memory controller 110 and generate signals associated with the operations, such as an active signal ACT, a precharge signal PCG, a read signal RD, and a write signal WR. The active signal ACT may be a signal instructing an active operation, the precharge signal PCG may be a signal instructing a precharge operation, the read signal RD may be a signal instructing the read operation, and the write signal WR may be a signal instructing the write operation.

The command decoder 211 may decode signals transmitted through the management bus Manage_BUS to find out information about operations and settings instructed through the management bus Manage_BUS.

The address control circuit 215 may classify an address received from the command decoder 211 into a row address R_ADD and a column address C_ADD, and transmit the row address R_ADD and the column address C_ADD to the row circuit 250 and the column circuit 260, respectively. The address control circuit 215 may classify the received address into the row address R_ADD when the active operation is instructed based on a result of the decoding of the command decoder 211. The address control circuit 215 may classify the received address into the column address C_ADD when the read and write operations are instructed based on the result of the decoding of the command decoder 211.

The nonvolatile memory circuit 230 may store information necessary for the operation of the memory 120 therein. The information necessary for the operation of the memory 120 may include repair information for repairing failed memory cells of the memory array 240, and setting information for setting the operation of the memory 120. The information stored in the nonvolatile memory circuit 230 may be transmitted to the latch circuits 270 and 295 and be used in the latch circuits 270 and 295. A process of transmitting the information stored in the nonvolatile memory circuit 230 to the latch circuits 270 and 295 is referred to as a boot-up operation. The reason why the information stored in the nonvolatile memory circuit 230 is not used immediately but is transmitted to the latch circuits 270 and 295 and then stored and used in the latch circuits 270 and 295 is as follows. Because the nonvolatile memory circuit 230 is configured in an array form, it takes a predetermined amount of time to call the data stored therein. However, the information stored in the nonvolatile memory circuit 230 requires it to be used immediately. Accordingly, the boot-up operation may be performed in which the information stored in the nonvolatile memory circuit 230 is transmitted to the latch circuits 270 and 295. After the boot-up operation, the information stored in the latch circuits 270 and 295 may be used. A nonvolatile memory circuit such as an e-fuse array circuit may be used as the nonvolatile memory circuit 230.

During the boot-up operation, the repair latch circuit 270 may store repair information transmitted from the nonvolatile memory circuit 230. The repair latch circuit 270 may include a row repair latch unit 271 and a column repair latch unit 275. The row repair latch unit 271 may store information for repairing a row among the repair information transmitted from the nonvolatile memory circuit 230. The information for repairing the row may include a repair row address REPAIR_R_ADD indicating a defective row in the memory array 240. The column repair latch unit 275 may store information for repairing a column among the repair information transmitted from the nonvolatile memory circuit 230. The information for repairing the column may include a repair column address REPAIR_C_ADD indicating a defective column in the memory array 240. Each of the row repair latch unit 271 and the column repair latch unit 275 may include a plurality of latches.

The memory array 240 may include a plurality of memory cells arranged between a plurality of rows and a plurality of columns. The plurality of memory cells may store data therein.

The repair circuit 280 may include a row repair unit 281 for row repair and a column repair unit 285 for column repair. The row repair unit 281 may compare the repair row address REPAIR_R_ADD received from the row repair latch unit 271 with the row address R_ADD received from the address control circuit 215, and transmit the comparison result to the row circuit 250. The column repair unit 285 may compare the repair column address REPAIR_C_ADD received from the column repair latch unit 275 with the column address C_ADD received from the address control circuit 215, and transmit the comparison result to the column circuit 260.

The row circuit 250 activates a word line selected by the row address R_ADD in the memory array 240 when the active signal ACT is activated. When the row repair unit 281 notifies the row circuit 250 that the row address R_ADD coincides with the repair row address REPAIR_R_ADD, that is, that a row to be accessed is a defective row, the row circuit 250 may activate a redundancy word line without activating a word line corresponding to the row address R_ADD. That is, a row or a word line corresponding to the repair row address REPAIR_R_ADD stored in the row repair latch unit 271 may be replaced with a redundancy row or the redundancy word line. When the precharge signal PCG is activated, the row circuit 250 may deactivate the activated word line.

The column circuit 260 may access data of a column or a bit line selected by the column address C_ADD. When the read signal RD is activated, data may be outputted from the selected column. When the write signal WR is activated, data may be transmitted and written to the selected column. When the column repair unit 285 notifies the column circuit 260 that the column address C_ADD coincides with the repair column address REPAIR_C_ADD, that is, that a column to be accessed is a defective column, the column circuit 260 may access a redundancy column without accessing a column corresponding to the column address C_ADD. That is, a column or a bit line corresponding to the repair column address REPAIR_C_ADD stored in the column repair latch unit 275 may be replaced with a redundancy column or a redundancy bit line.

The setting latch circuit 295 may store the setting information transmitted from the nonvolatile memory circuit 230 during the boot-up operation. The setting information includes information required for various settings of the memory 120. Examples of the setting information may include information on levels of various voltages used in the memory 120, and information related to operation timing parameters of the memory 120. The setting latch circuit 295 may include a plurality of latches.

The setting circuit 291 may set various values required for operations of the memory 120 using the setting information stored in the setting latch circuit 295.

The boot-up control circuit 220 may generate a boot-up signal BOOT-UP. The boot-up signal BOOT-UP includes a signal that instructs the boot-up operation. When the boot-up signal BOOT-UP is activated, the nonvolatile memory circuit 230 may perform the boot-up operation of transmitting the information stored therein to the latch circuits 270 and 295. Because the memory 120 can operate normally after all information is updated in the latch circuits 270 and 295, the boot-up operation of updating the information stored in the nonvolatile memory circuit 230 to the latch circuits 270 and 295 may be performed during an initial operation period of the memory 120. That is, the boot-up control circuit 220 may activate the boot-up signal BOOT-UP during an initialization operation of the memory 120.

Latch circuits such as the repair latch circuit 270 and the setting latch circuit 295, among the most widely used circuits, are not only in a memory but also in all types of semiconductors. As the integration of a semiconductor increases, a capacitance value of a storage node of a latch circuit decreases. Thus, soft errors in which data of the storage node of the latch circuit is changed are increasing. The soft errors refer to a phenomenon in which data stored in a latch circuit is changed by cosmic rays such as alpha particles. When the soft errors occur in the information stored in the repair latch circuit 270 and the setting latch circuit 295, a concern in the operations of the memory 120 may occur, such as a repair operation of the memory 120 not being performed correctly or a setting value of the memory 120 being changed.

In order to solve the concern of the information stored in the repair latch circuit 270 and the setting latch circuit 295 being changed due to the soft errors, a method of performing the boot-up operation even after the initialization operation period of the memory 120 may be used. The soft errors include errors that occur in the latch circuits 270 and 295 and rarely occur in the nonvolatile memory circuit 230. That is, although the data stored in the latch circuits 270 and 295 may be changed by the cosmic rays, etc., the possibility that the data stored in the nonvolatile memory circuit 230 is changed is almost zero. Therefore, even though errors occur in the data stored in the latch circuits 270 and 295, data with no errors stored in the nonvolatile memory circuit 230 may be updated to the latch circuits 270 and 295 again when the boot-up operation is performed again. Accordingly, the data with no errors may be stored in the latch circuits 270 and 295 again.

The boot-up control circuit 220 may further activate the boot-up signal BOOT-UP not only during the initialization operation period of the memory 120 but also after the initialization operation period, thereby controlling the boot-up operation to be additionally performed not only during the initialization operation period of the memory 120 but also after the initialization operation period. For example, the boot-up control circuit 220 may activate the boot-up signal BOOT-UP during the initialization operation period and then periodically activate the boot-up signal BOOT-UP thereafter. A criterion for a period of activating the boot-up signal BOOT-UP may include time or an operation. For example, the boot-up signal BOOT-UP may be activated once for each “X” hour, or may be activated once whenever the active operation is performed “Y” times.

FIG. 3 is a block diagram illustrating another embodiment of the memory 120 illustrated in FIG. 1.

In an embodiment of FIG. 3, as compared to an embodiment of FIG. 2, the memory 120 may further include a latch error risk determination circuit 310, and a boot-up control circuit 320 may operate differently from the boot-up control circuit 220 illustrated in FIG. 2.

The latch error risk determination circuit 310 may determine a risk of error occurrence in a repair latch circuit 270 and a setting latch circuit 295. The latch error risk determination circuit 310 may activate a risk signal RISK when it is determined that the risk of error occurrence in the latch circuits 270 and 295 is high. That is, the latch error risk determination circuit 310 may activate the risk signal RISK when it is determined that there is a high possibility that soft errors occur in the latch circuits 270 and 295.

The boot-up control circuit 320 may activate a boot-up signal BOOT-UP during an initialization operation period of the memory 120. In addition, the boot-up control circuit 320 may activate the boot-up signal BOOT-UP in response to the activation of the risk signal RISK. The activation of the risk signal RISK may represent that there is a high possibility that the soft errors occur in the latch circuits 270 and 295. As a boot-up operation is performed again to update information stored in the latch circuits 270 and 295, the soft errors may be resolved.

Figure 4:
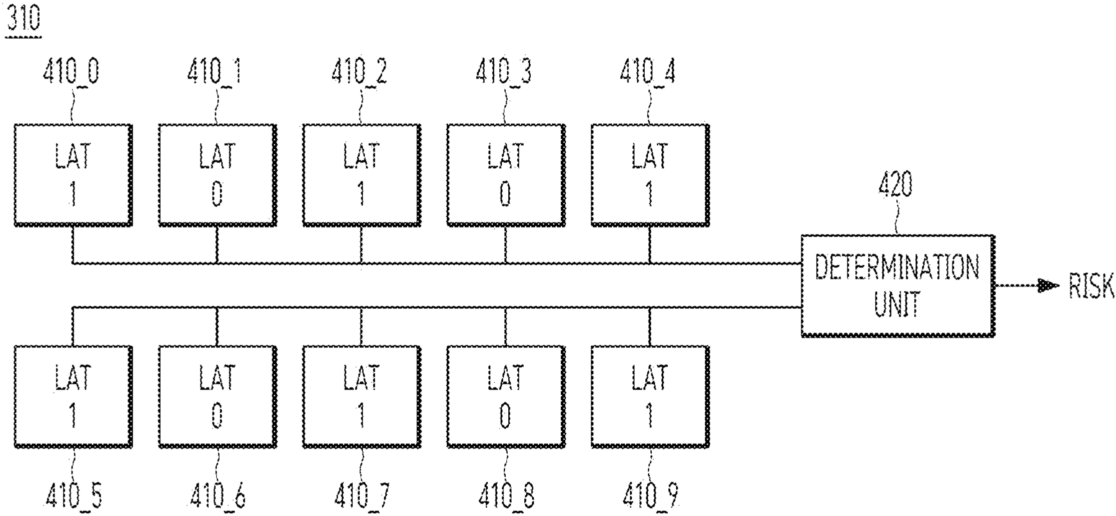
FIG. 4 is a block diagram illustrating an embodiment of a latch error risk determination circuit illustrated in FIG. 3.

FIG. 4 is a block diagram illustrating an embodiment of the latch error risk determination circuit 310 illustrated in FIG. 3.

Referring to FIG. 4, the latch error risk determination circuit 310 may include a plurality of latches 410_0 to 410_9 and a determination unit 420.

The plurality of latches 410_0 to 410_9 may store respective initial values therein. For example, "10101" may be stored in five latches 410_0 to 4104, and "10101" may also be stored in the other five latches 410_5 to 410_9.

The determination unit 420 may activate the risk signal RISK when a number of latches that store values changed from the initial values among the latches 410_0 to 410_9 is greater than or equal to a threshold value, e.g., 1. The determination unit 420 may compare the values stored in the latches 410_0 to 410_4 with the values stored in the latches 410_5 to 410_9, and determine as the comparison result which latches have errors. For example, when "10101" is stored in the latches 410_0 to 410_4, and "10100" is stored in the latches 410_5 to 410_9, the determination unit 420 may determine that an error occurs in one latch.

To better identify the risk of soft error occurrence, the latches 410_0 to 410_9 may be distributed to different locations in the memory 120. In addition, as the number of latches 410_0 to 410_9 increases, the risk may be identified better.

FIG. 5 is a block diagram illustrating another embodiment of the memory 120 illustrated in FIG. 1.

In an embodiment of FIG. 5, the memory 120 may perform a boot-up operation according to the instruction of the memory controller 110, and notify the memory controller 110 of a risk of soft error occurrence.

A risk signal RISK generated by a latch error risk determination circuit 310 might not be transmitted to a boot-up control circuit 520 but may be transmitted to the memory controller 110 through a risk signal transmission circuit 307. The risk signal RISK may be transmitted to the memory controller 110 through various pads of the memory 120. For example, the risk signal RISK may be transmitted to the memory controller 110 using one of a data mask inversion (DMI) pad, a data pad, and an alert pad of the memory 120. Alternatively, a new pad for transmitting the risk signal RISK may be included in the memory 120.

When the memory controller 110 receives an activated risk signal from the memory 120, the memory controller 110 may determine that there is a high possibility that soft errors occur in latch circuits 270 and 295 of the memory 120, and instruct the memory 120 to perform the boot-up operation to resolve the soft errors.

A command decoder 511 may further generate a boot signal BOOT, as compared to the command decoder 211 illustrated in FIG. 2. The command decoder 511 may activate the boot signal BOOT when the memory controller 110 instructs the memory 120 to perform the boot-up operation based on a result of decoding commands and addresses.

The boot-up control circuit 520 may activate the boot-up signal BOOT-UP during an initialization operation of the memory 120. Thereafter, when the boot signal BOOT is activated, that is, when the memory controller 110 instructs the memory 120 to perform the boot-up operation, the boot-up control circuit 520 may activate the boot-up signal BOOT-UP. That is, the boot-up control circuit 520 may control a nonvolatile memory circuit 230 so that the boot-up operation is performed during the initialization operation of the memory 120 and when the memory controller 110 instructs the memory 120 to perform the boot-up operation.

FIG. 6 is a block diagram illustrating another embodiment of the memory 120 illustrated in FIG. 1.

In an embodiment of FIG. 6, the memory 120 may perform a boot-up operation according to the instruction of the baseboard management controller 130, and notify the baseboard management controller 30 of a risk of soft error occurrence.

When a risk signal RISK generated by a latch error risk determination circuit 310 is activated, a management bus transmitting/receiving circuit 205 may notify the baseboard management controller 130 that the risk signal RISK is activated, through the management bus Manage_BUS.

When the baseboard management controller 130 receives, from the memory 120, information that the risk signal RISK is activated, the baseboard management controller 130 may determine that there is a high possibility that soft errors occur in latch circuits 270 and 295 of the memory 120. Further, the baseboard management controller 130 may instruct the memory 120 to perform the boot-up operation to resolve the soft errors.

A command decoder 611 may further generate a boot signal BOOT, as compared to the command decoder 211 illustrated in FIG. 2. The command decoder 611 may activate the boot signal BOOT when the baseboard management controller 130 instructs the memory 120 to perform the boot-up operation based on a result of decoding signals transmitted through the management bus Manage_BUS.

A boot-up control circuit 520 may activate a boot-up signal BOOT-UP during an initialization operation of the memory 120. Thereafter, when the boot signal BOOT is activated, that is, when the baseboard management controller 130 instructs the memory 120 to perform the boot-up operation, the boot-up control circuit 520 may activate the boot-up signal BOOT-UP. That is, the boot-up control circuit 520 may control a nonvolatile memory circuit 230 so that the boot-up operation is performed during the initialization operation of the memory 120 and when the baseboard management controller 130 instructs the memory 120 to perform the boot-up operation.

It is described in an embodiment of FIG. 6 that when the latch error risk determination circuit 310 detects the risk of soft error occurrence, the memory 120 notifies the baseboard management controller 130 of the risk of soft error occurrence, and the baseboard management controller 130 instructs the memory 120 to perform the boot-up operation in response to the notification. Differently from the embodiment, the following modified embodiment may be possible. When the latch error risk determination circuit 310 detects the risk of soft error occurrence, the memory 120 may notify the baseboard management controller 130 of the risk of soft error occurrence. Then, the baseboard management controller 130 may notify the memory controller 110 through the IPMI interface that there is the risk of soft error occurrence in the memory 120, and the memory controller 110 may instruct the memory 120 to perform the boot-up operation in response to the notification from the baseboard management controller 130.

Although embodiments according to the technical spirit of the present disclosure have been described above with reference to the accompanying drawings, this is only for describing the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical spirit of the present disclosure defined in the following claims, and it should be construed that these substitutions, modifications, and changes belong to the scope of the present disclosure. Furthermore, the embodiments may be combined to form additional embodiments.

What is claimed is:

1. A memory comprising:

a memory array configured to store write data therein and provide the write data stored therein as read data;

a nonvolatile memory circuit configured to store repair information therein;

a repair latch circuit configured to receive the repair information from the nonvolatile memory circuit and store the received repair information during a boot-up operation;

a repair circuit configured to repair the memory array using the stored repair information of the repair latch circuit;

a boot-up control circuit configured to generate a boot-up signal; and a latch error risk determination circuit configured to determine a risk of error occurrence of the repair latch circuit, wherein the boot-up operation is performed during an initial operation period of the memory and is performed one or more times thereafter, wherein during the boot-up operation, the nonvolatile memory circuit transmits the repair information to the repair latch circuit in response to the boot-up signal, wherein the boot-up control circuit activates the boot-up signal during the initial operation period of the memory, and periodically activates the boot-up signal thereafter, and wherein the latch error risk determination circuit includes:

a plurality of latches, each configured to store an initial value therein; and a determination unit configured to determine that there is the risk of error occurrence in the repair latch circuit when a number of latches that store a value changed from the initial value among the plurality of latches is greater than or equal to a threshold value.

2. The memory of claim 1, wherein the plurality of latches of the latch error risk determination circuit are distributed to different locations in the memory.

3. A memory comprising:

a memory array configured to store write data therein and provide the write data stored therein as read data;

a nonvolatile memory circuit configured to store repair information therein;

a repair latch circuit configured to receive the repair information from the nonvolatile memory circuit and store the received repair information during a boot-up operation;

a repair circuit configured to repair the memory array using the stored repair information of the repair latch circuit;

a boot-up control circuit configured to generate a boot-up signal; and a latch error risk determination circuit configured to determine a risk of error occurrence of the repair latch circuit, wherein the boot-up operation is performed during an initial operation period of the memory and is performed one or more times thereafter, wherein, during the boot-up operation, the nonvolatile memory circuit transmits the repair information to the repair latch circuit in response to the boot-up signal, wherein the boot-up control circuit activates the boot-up signal during the initial operation period of the memory, and activates the boot-up signal when the boot-up operation is instructed by an external device of the memory, and wherein, when the latch error risk determination circuit determines that there is the risk of error occurrence in the repair latch circuit, the memory notifies a memory controller of the risk of error occurrence.

4. A memory comprising:

a memory array configured to store write data therein and provide the write data stored therein as read data;

a nonvolatile memory circuit configured to store repair information therein;

a repair latch circuit configured to receive the repair information from the nonvolatile memory circuit and store the received repair information during a boot-up operation;

a repair circuit configured to repair the memory array using the stored repair information of the repair latch circuit;

a boot-up control circuit configured to generate a boot-up signal; and a latch error risk determination circuit configured to determine a risk of error occurrence of the repair latch circuit, wherein the boot-up operation is performed during an initial operation period of the memory and is performed one or more times thereafter, wherein, during the boot-up operation, the nonvolatile memory circuit transmits the repair information to the repair latch circuit in response to the boot-up signal, wherein the boot-up control circuit activates the boot-up signal during the initial operation period of the memory, and activates the boot-up signal when the boot-up operation is instructed by an external device of the memory, and wherein, when the latch error risk determination circuit determines that there is the risk of error occurrence in the repair latch circuit, the memory notifies a baseboard management controller (BMC) of the risk of error occurrence.

5. The memory of claim 1, wherein the nonvolatile memory circuit further stores setting information therein, and the memory further comprises:

a setting latch circuit configured to store the setting information received from the nonvolatile memory circuit during the boot-up operation; and a setting circuit configured to perform a setting operation of the memory using the setting information stored in the setting latch circuit.

6. A memory system comprising:

a memory; and a memory controller configured to control the memory, wherein the memory includes:

a memory array configured to store write data received from the memory controller and provide the memory controller with the write data stored therein as read data;

a nonvolatile memory circuit configured to store repair information therein;

a repair latch circuit configured to receive the repair information from the nonvolatile memory circuit and store the received repair information during a boot-up operation;

a repair circuit configured to repair the memory array using the stored repair information of the repair latch circuit;

a boot-up control circuit configured to a boot-up signal; and a latch error risk determination circuit configured to determine a risk of error occurrence of the repair latch circuit, wherein the boot-up operation is performed during an initial operation period of the memory and is performed one or more times thereafter, wherein during the boot-up operation, the nonvolatile memory circuit transmits the repair information to the repair latch circuit in response to the boot-up signal, wherein the boot-up control circuit activates the boot-up signal during the initial operation period of the memory, and activates the boot-up signal when the latch error risk determination circuit determines that there is the risk of error occurrence in the repair latch circuit, and the latch error risk determination circuit includes:

a plurality of latches, each configured to store an initial value therein; and a determination unit configured to determine that there is the risk of error occurrence in the repair latch circuit when a number of latches that store a value changed from the initial value among the plurality of latches is greater than or equal to a threshold value.

7. The memory system of claim 6, wherein the plurality of latches of the latch error risk determination circuit are distributed to different locations in the memory.

8. A memory system comprising:

a memory; and a memory controller configured to control the memory, wherein the memory includes:

a memory array configured to store write data received from the memory controller and provide the memory controller with the write data stored therein as read data;

a nonvolatile memory circuit configured to store repair information therein;

a repair latch circuit configured to receive the repair information from the nonvolatile memory circuit and store the received repair information during a boot-up operation;

a repair circuit configured to repair the memory array using the stored repair information of the repair latch circuit;

a boot-up control circuit configured to a boot-up signal; and a latch error risk determination circuit configured to determine a risk of error occurrence of the repair latch circuit, wherein the boot-up operation is performed during an initial operation period of the memory and is performed one or more times thereafter, wherein during the boot-up operation, the nonvolatile memory circuit transmits the repair information to the repair latch circuit in response to the boot-up signal, wherein the boot-up control circuit activates the boot-up signal during the initial operation period of the memory, and activates the boot-up signal when the boot-up operation is instructed by the memory controller, wherein, when the latch error risk determination circuit determines that there is the risk of error occurrence in the repair latch circuit, the memory notifies the memory controller of the risk of error occurrence, and the memory controller instructs the memory to perform the boot-up operation in response to the risk of error occurrence notified by the memory.

9. A memory system comprising:

a memory;

a memory controller configured to control the memory; and a baseboard management controller (BMC) connected to the memory through a management bus, wherein the memory includes:

a memory array configured to store write data received from the memory controller and provide the memory controller with the write data stored therein as read data;

a nonvolatile memory circuit configured to store repair information therein;

a repair latch circuit configured to receive the repair information from the nonvolatile memory circuit and store the received repair information during a boot-up operation;

a repair circuit configured to repair the memory array using the stored repair information of the repair latch circuit;

a boot-up control circuit configured to a boot-up signal; and a latch error risk determination circuit configured to determine a risk of error occurrence of the repair latch circuit, wherein the boot-up operation is performed during an initial operation period of the memory and is performed one or more times thereafter, wherein, during the boot-up operation, the nonvolatile memory circuit transmits the repair information to the repair latch circuit in response to the boot-up signal, wherein, when the latch error risk determination circuit determines that there is the risk of error occurrence in the repair latch circuit, the memory notifies the baseboard management controller of the risk of error occurrence, wherein the baseboard management controller notifies the memory controller of the risk of error occurrence notified by the memory, and wherein the memory controller instructs the memory to perform the boot-up operation in response to the risk of error occurrence notified by the baseboard management controller.

10. A memory system comprising:

a memory; and a baseboard management controller connected to the memory through a management bus, wherein the memory includes:

a memory array configured to store write data therein and provide the write data stored therein as read data;

a nonvolatile memory circuit configured to store repair information therein;

a repair latch circuit configured to receive the repair information from the nonvolatile memory circuit and store the repair information during a boot-up operation; and a repair circuit configured to repair the memory array using the stored repair information of the repair latch circuit, wherein the boot-up operation is performed during an initial operation period of the memory and thereafter when the baseboard management controller instructs the memory to perform the boot-up operation.

11. The memory system of claim 10, wherein the memory further includes a latch error risk determination circuit configured to determine a risk of error occurrence of the repair latch circuit, when the latch error risk determination circuit determines that there is the risk of error occurrence in the repair latch circuit, the memory notifies the baseboard management controller of the risk of error occurrence, and the baseboard management controller instructs the memory to perform the boot-up operation in response to the risk of error occurrence notified by the memory.

* * * * *